United States Patent
Inoue et al.

[11] Patent Number: 6,146,906
[45] Date of Patent: Nov. 14, 2000

[54] DC MAGNETRON SPUTTERING METHOD FOR MANUFACTURING ELECTRODE OF FERROELECTRIC CAPACITOR

[75] Inventors: Naoya Inoue; Yoshihiro Hayashi, both of Tokyo, Japan

[73] Assignee: NEC Corporation, Tokyo, Japan

[21] Appl. No.: 09/397,199

[22] Filed: Sep. 16, 1999

[30] Foreign Application Priority Data

Sep. 16, 1998 [JP] Japan .................................. 10-261737

[51] Int. Cl.$^7$ ....................... H01L 21/00; H01L 21/8242; H01L 21/44
[52] U.S. Cl. ............................. 438/3; 438/240; 438/608; 204/192.22; 204/192.18; 427/79; 427/81; 427/100; 427/375
[58] Field of Search ................................ 438/3, 240, 608; 204/192.22, 192.18; 427/79, 81, 100, 375

[56] References Cited

U.S. PATENT DOCUMENTS

| | | | |
|---|---|---|---|
| 5,486,277 | 1/1996 | Barbee, Jr. et al. | 204/192.15 |
| 5,790,366 | 8/1998 | Desu et al. | 361/305 |
| 6,025,205 | 2/2000 | Park et al. | 438/3 |
| 6,054,331 | 4/2000 | Woo et al. | 438/3 |

FOREIGN PATENT DOCUMENTS

| | | |
|---|---|---|
| 0 855 738 | 7/1998 | European Pat. Off. . |
| 0 883 167 | 12/1998 | European Pat. Off. . |
| 7-245237 | 9/1995 | Japan . |
| 8-51165 | 2/1996 | Japan . |
| 9-67193 | 3/1997 | Japan . |
| 9-116111 | 5/1997 | Japan . |
| 9-148535 | 6/1997 | Japan . |

OTHER PUBLICATIONS

T. Nakamura et al., "Preparation of Pb(Zr;Ti)O$_3$ thin films on electrodes including IrO$_2$", Appl. Phys. Lett. 65(12), pp. 1522–1524, Sep. 1994.

Hag–Ju Cho et al., "Preparation and Characterization of Iridium Oxide Thin Films Grown by DC Reactive Sputtering", Jpn. J. Appl. Phys. vol. 36, part 1, No. 3B, pp. 1722–1727, Mar. 1997.

M. Shimizu et al., "Pb(Zr,Ti)O$_3$ Thin Film Deposition on Ir and IrO$_2$ Electrodes by MOCVD", Journal of the Korean Physical Society, vol. 32, pp. S1349–S1352, Feb. 1998.

*Primary Examiner*—John F. Niebling
*Assistant Examiner*—Alexander G. Ghyka

[57] ABSTRACT

In a method for manufacturing a capacitor including a lower electrode, a ferroelectric layer formed on the lower electrode, and an upper electrode formed on the ferroelectric layer, at least one of the lower and upper electrodes is made of laminated metal and conductive oxide. The laminated metal and conductive oxide are deposited by a DC magnetron reactive sputtering process using one metal target and mixture gas including oxygen wherein a ratio of oxygen in the mixture gas and a substrate temperature are definite and a DC input power is changed depending on the metal and the conductive oxide.

28 Claims, 15 Drawing Sheets

DC MAGNETRON SPUTTERING METHOD FOR MANUFACTURING ELECTRODE OF FERROELECTRIC CAPACITOR

BACKGROUND OF THE INVENTION

1. Field of the Invention

The present invention relates to a method for manufacturing a capacitor using a ferroelectric thin layer, and more particularly to a DC magnetron reactive sputtering method for manufacturing an electrode of such a capacitor.

2. Description of the Related Art

In a dynamic random access memory (DRAM) device, the integration has become highly developed. Generally, one memory cell of a DRAM device is constructed by one transistor and one capacitor. Therefore, in order to enhance the integration, as the transistor needs to be fined, the capacitor also needs to be fined, which reduces the storage capacitance of the capacitor.

On the other hand, in order to suppress the above-mentioned reduction of the storage capacitance of the capacitor, a ferroelectric layer made of ferroelectric material such as Pb (Zr, Ti) $O_3$ (PZT) or (Ba, Sr) $TiO_3$ (BST) has been used as a high-dielectric layer. Note that, if such a ferroelectric layer is used in a capacitor of a DRAM device, even after the power supply is turned OFF, data stored in the capacitor is not erased. Therefore, the DRAM device can serve as a nonvolatile memory which is called a ferroelectric RAM (FeRAM) device.

Since the ferroelectric material is a kind of compound metal oxide, electrodes used for a ferroelectric capacitor are preferably made of material which does not allow the ferroelectric material to be reduced (deoxidized). Note that, if the ferroelectric material is reduced, the leakage current is increased, the dielectric constant is decreased, and the remanent polarization is decreased, thus deteriorating the capacitor characteristics.

As the above-mentioned electrode materials, noble metal such as platinum (Pt) and conductive oxide such as iridium oxide ($IrO_2$) are known. Particularly, in view of good polarization fatigue properties, $IrO_2$ is promising as the electrode material, since $IrO_2$ exhibits excellent barrier performance against oxygen (see JP-A-7-245237).

In a first prior art method for manufacturing an $IrO_2$ electrode for PZT as ferroelectric material (see T. Nakamura et al., "Preparation of Pb (Zr, Ti) $O_3$ thin films on electrodes including $IrO_2$", Appl. Phys. lett. 65 (12), pp. 1522–1524, September 1994), an $IrO_2$ lower electrode and an $IrO_2$ upper electrode are deposited on a substrate by an RF magnetron reactive sputtering process using an Ir target and Ar/$O_2$ mixture gas without heating the substrate, i.e., at room temperature. Then, the $IrO_2$ electrodes are annealed at 400° C. for 15 minutes. Thus, the polarization fatigue characteristics of PZT can be improved.

In the above-described first prior art method, however, even after the annealing process is completed, Ir is not combined sufficiently with oxygen, so that an Ir phase exists in an interface with PZT. Therefore, the Ir phase may slightly interact with PZT at their interface, which deteriorates the polarization fatigue characteristics (see Hag-Ju Cho et al., "Preparation and characterization of Iridium Oxide Thin Films Deposited by DC Reactive Sputtering", Jpn. J. Appl. Phys. Vol. 36, part 1, No. 3B, pp. 1722–1727, March 1997).

Note that since $IrO_2$ serves as an excellent barrier against oxygen, $IrO_2$ shuts off the supply of oxygen to PZT while an Ir phase generated by the incomplete oxidation of Ir absorbs the oxygen of PZT. Therefore, if $IrO_2$ is used as the upper electrode of PZT, the above-mentioned deterioration of the polarization fatigue characteristics may occur. On the other hand, if $IrO_2$ is used as the lower electrode of PZT, the interface between the $IrO_2$ lower electrode and PZT may be short of oxygen; however, this shortage of oxygen can be compensated for by the supply of oxygen from the upper surface of PZT.

In a second prior art method for manufacturing an $IrO_2$ electrode for PZT as ferroelectric material (see M. Shimizu et al., "Pb (Zr, Ti) $O_3$ Thin Film Deposition on Ir and $IrO_2$ Electrodes by MOCVD", Journal of the Korean Physical Society, Vol. 32, pp. S1349–S1352, February 1998), an $IrO_2$ electrode for PZT is deposited on a substrate by an RF magnetron reactive sputtering process using an Ir target and Ar/$O_2$ mixture gas while heating the substrate at a high temperature such as 530° C. Thus, the $IrO_2$ electrode is completely oxidized, which dissolves the Ir phase at the interface between the $IrO_2$ electrode and PZT.

However, if the above-described second prior art method is applied to the upper electrode of PZT, the upper surface of PZT is exposed to a high temperature under a low pressure, thus changing the properties of the upper surface of PZT. Therefore, the polarization fatigue characteristics of PZT is deteriorated.

In view of the foregoing, in a method for manufacturing conductive oxide electrodes for a ferroelectric capacitor, the interface between the conductive oxide electrodes and the ferroelectric material should be sufficiently oxidized at a relatively low temperature which avoids the deterioration of the properties of the surfaces of the ferroelectric material.

Additionally, generally, each conductive oxide electrode for a ferroelectric capacitor needs to be connected to an interconnect (wiring) layer. In this case, if the conductive oxide electrode is connected directly to the wiring layer, the material of the wiring layer may be oxidized by oxygen included in the conductive oxide electrode, which invites disinterconnect therebetween. Therefore, each electrode for the ferroelectric capacitor is preferably constructed by a conductive oxide layer and a metal layer which has a good adhesion to the material of the wiring layer. For example, the electrode for PZT is made of Ir/$IrO_2$ (see JP-A -8-51165 & JP-A-9-148535). However, no concrete method for manufacturing such Ir/$IrO_2$ electrodes has been known.

SUMMARY OF THE INVENTION

It is an object of the present invention to provide a simple DC magnetron sputtering method for manufacturing a metal conductive oxide electrode for a ferroelectric capacitor.

According to the present invention, in a method for manufacturing a capacitor including a lower electrode, a ferroelectric layer (110, 210, 310) formed on the lower electrode, and an upper electrode formed on the ferroelectric layer, at least one of the lower and upper electrodes is made of laminated metal and conductive oxide. The laminated metal and conductive oxide are deposited by a DC magnetron reactive sputtering process using one metal target and mixture gas including oxygen wherein a ratio of oxygen in the mixture gas and a substrate temperature are definite and a DC input power is changed depending on the metal and the conductive oxide.

Thus, the laminated metal/conductive oxide layers can be easily formed.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Before the description of the preferred embodiments, the principle of the present invention will be explained with reference to FIGS. 1, 2, 3A and 3B.

Figure 1:
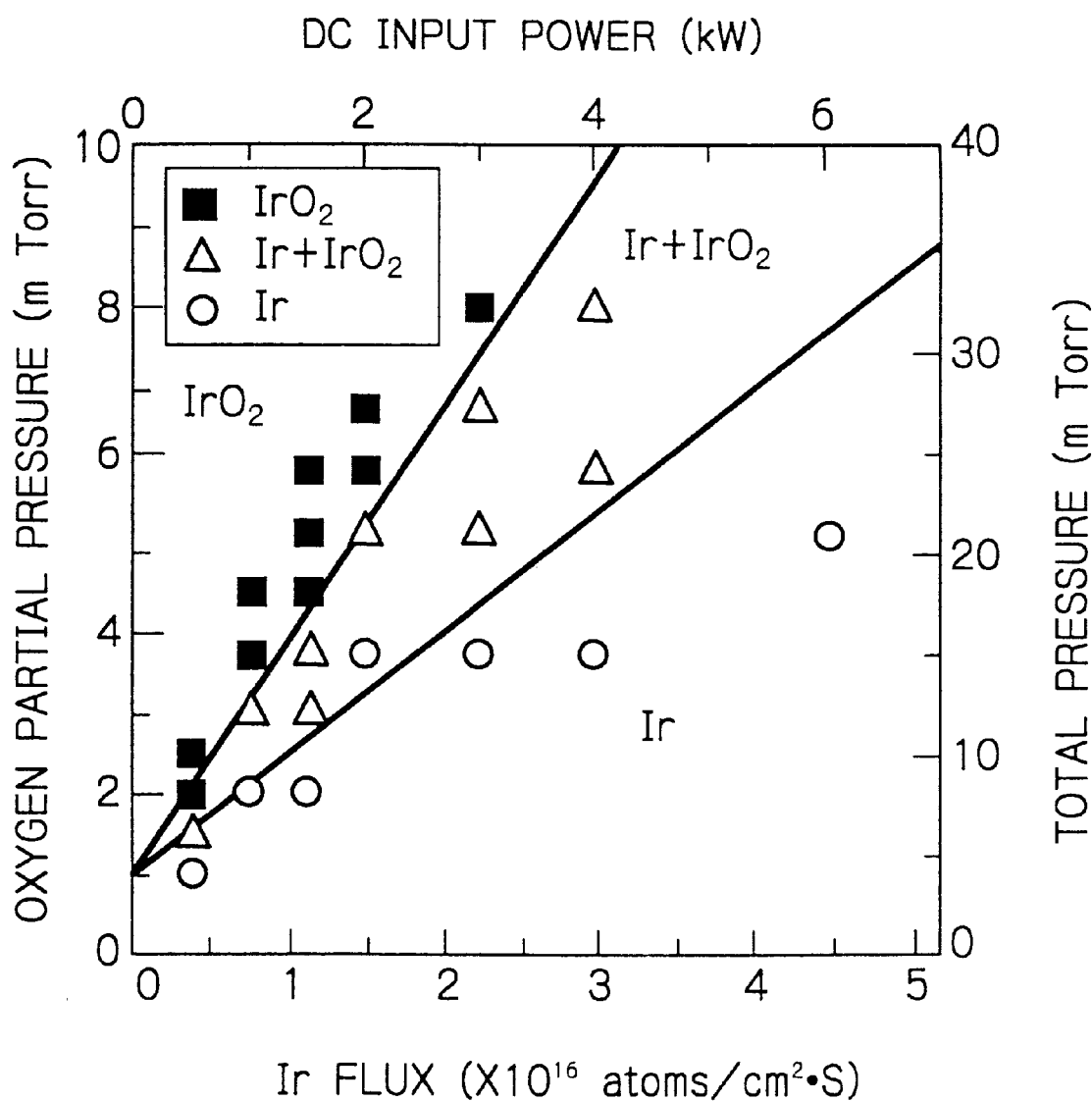
FIG. 1 is a phase diagram of Ir/IrO$_2$ manufactured by a DC magnetron reactive sputtering process.

FIG. 1 is a phase diagram of Ir/IrO$_2$ manufactured by a DC magnetron reactive sputtering process using an Ir target and Ar/O$_2$ mixture gas where the ratio of Ar/O$_2$ is 75/25 and the substrate temperature is 200° C. In FIG. 1, the abscissa designates an Ir flux which is in proportion to the DC input power, and the ordinate designates an oxygen partial pressure which is in proportion to the total pressure since the ratio of Ar/O$_2$ is definite. That is, when the ratio of the Ir flux to the oxygen partial pressure is smaller than approximately $3.0 \times 10^{15}$ [atoms/(cm$^2$·s·mTorr)], a layer of an IrO$_2$ single phase is deposited. Also, when the ratio of the Ir flux to the oxygen partial pressure is larger than approximately $4.0 \times 10^{15}$ [atoms/(cm$^2$·s·mTorr)], a layer of an Ir single phase is deposited. Further, when the ratio of the Ir flux to the oxygen partial pressure is approximately between $3.0 \times 10^{15}$ and $4.0 \times 10^{15}$ [atoms/(cm$^2$·s·mTorr)], a layer of an Ir/IrO$_2$ mixture phase is deposited.

Therefore, under the condition that the Ir flux is definite, as the oxygen partial pressure is increased from a low pressure to a high pressure, so that the supply of oxygen is increased, a layer of the Ir single phase is first deposited, and then, a layer of the Ir/IrO$_2$ mixture phase is deposited. Finally, a layer of the IrO$_2$ single phase is deposited. In other words, while the ratio of Ar/O$_2$, the substrate temperature and the Ir flux (the DC input power) is unchanged, when only the oxygen partial pressure (the total pressure) is changed, can the composition of Ir and IrO$_2$ be freely selected.

On the other hand, under the condition that the oxygen partial pressure is definite, as the Ir flux is increased from a low flux to a high flux, a layer of the IrO$_2$ single phase is first deposited, and then, a layer of the Ir/IrO$_2$ mixture phase is deposited. Finally, a layer of the Ir single phase is deposited. In other words, while the ratio of Ar/O$_2$, the substrate temperature and the oxygen partial pressure (the total pressure) are unchanged, when only the Ir flux (the DC input power) is changed, can the composition of Ir and IrO$_2$ be freely selected.

Figure 2:
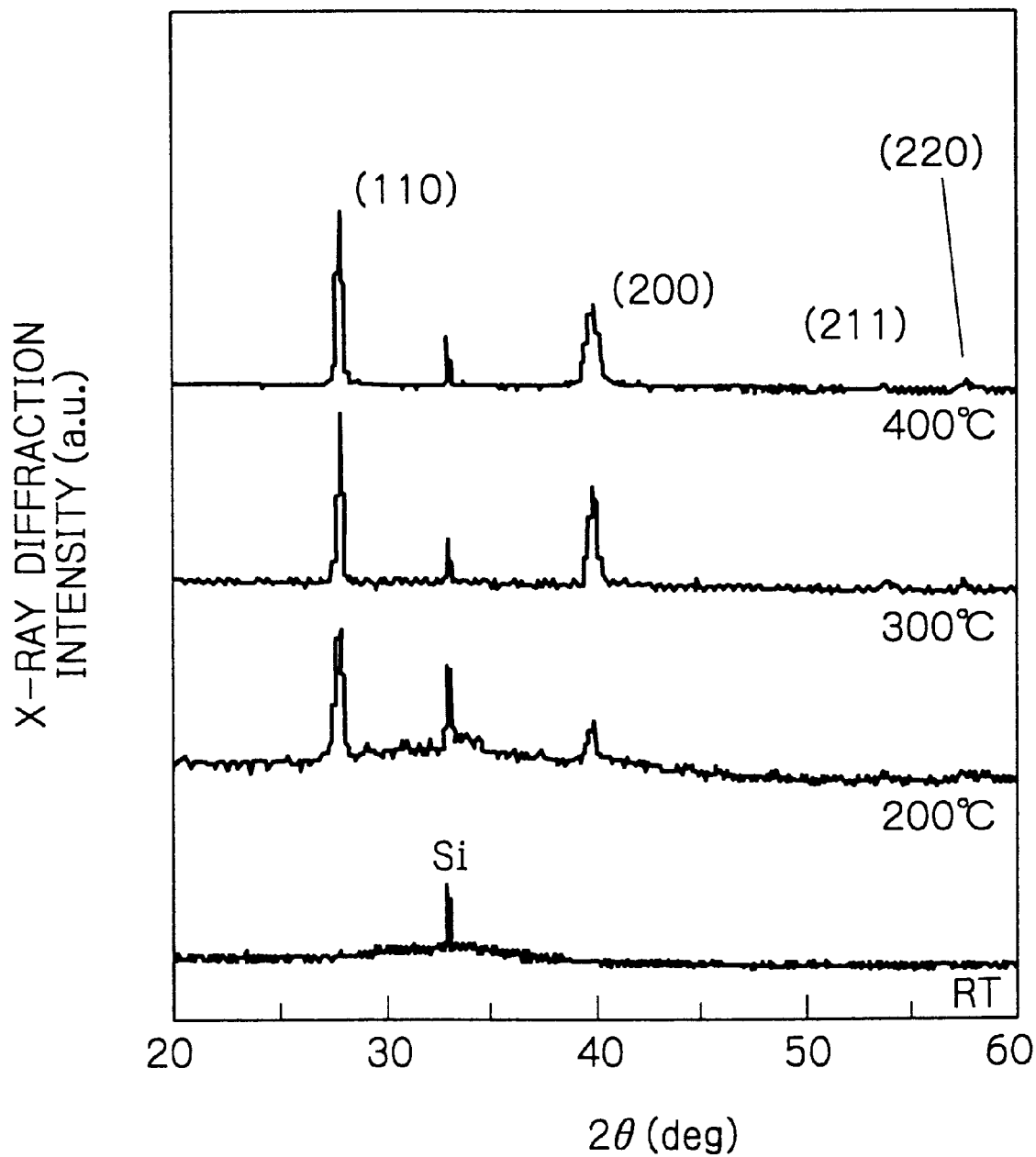
FIG. 2 is a diagram of X-ray diffraction intensity spectra of IrO$_2$ manufactured by a DC magnetron reactive sputtering process.

FIG. 2 is an X-ray diffraction intensity spectra of IrO$_2$ manufactured by a DC magnetron reactive sputtering process using an Ir target and Ar/O$_2$ mixture gas where the ratio of Ar/O$_2$ is 75/25. When the substrate temperature is at room temperature, there is no substantial peak intensity, which means that a deposited layer of IrO$_2$ is amorphous. When the substrate temperature is 200° C., the IrO$_2$ (110) peak intensity appears, which means that a deposited layer of IrO$_2$ is crystalline. Further, when the substrate temperature is increased to 300° C. or 400° C., the IrO$_2$ (200) peak intensity increases. Thus, the crystalline orientation characteristics of IrO$_2$ can be controlled by changing the substrate temperature.

As is apparent from FIG. 2, when the substrate temperature is lower than 200° C., the deposited IrO$_2$ becomes amorphous. Generally, the amorphous IrO$_2$ has an electrochemical catalyst effect, which enhances an oxidation-reduction reaction. This deteriorates the properties of the ferroelectric material. Therefore, it is preferable that the substrate temperature is higher than approximately 200° C.

Figure 3A:
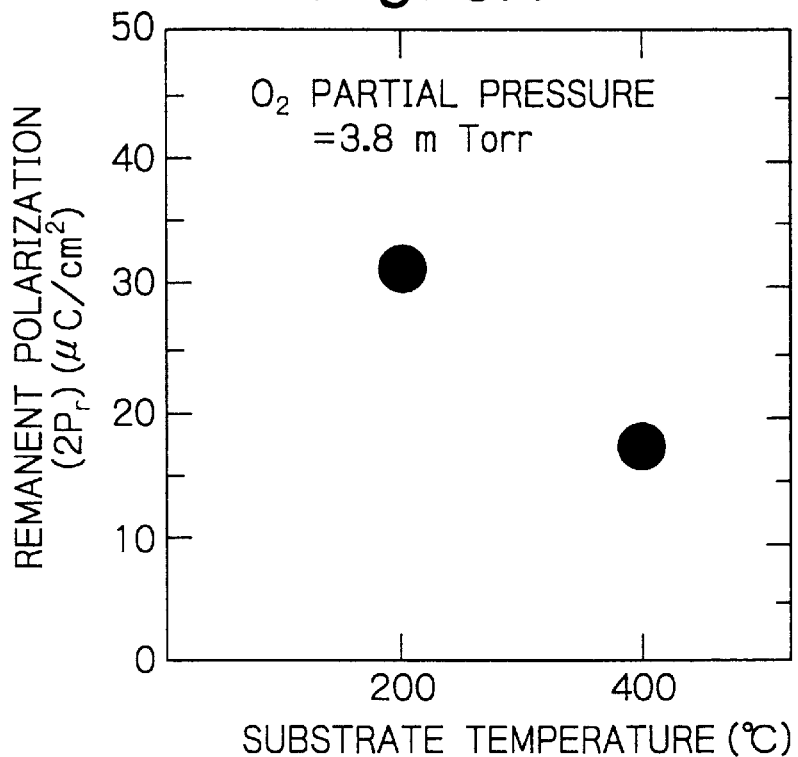
FIGS. 3A and 3B are diagrams showing the remanent polarization of the ferroelectric capacitor in relation to the substrate temperature and the oxygen partial pressure for depositing IrO$_2$.
Figure 3B:
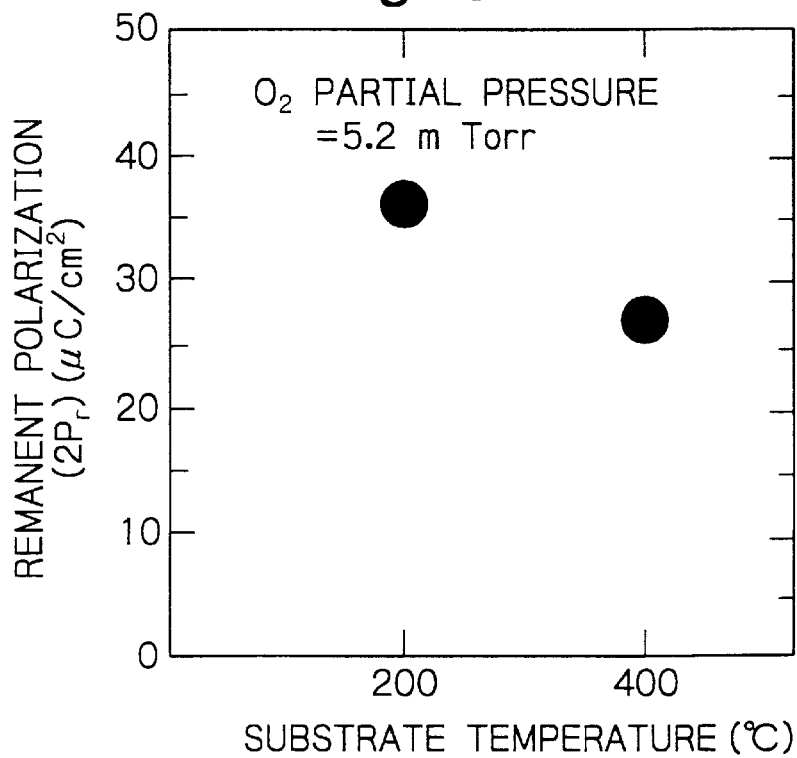

FIGS. 3A and 3B are diagrams showing the remanent polarization (2Pr) of the ferroelectric capacitor where the substrate temperature for depositing IrO$_2$ is changed. That is, when the substrate temperature is 400° C., the crystalline orientation of IrO$_2$ is disturbed, so that the remanent polarization is remarkably reduced, i.e., the properties of the ferroelectric capacitor are deteriorated. Therefore, it is preferable that the substrate temperature is lower than approximately 400° C.

In more detail, FIG. 3A shows a case where the oxygen partial pressure is 3.8 mTorr, and FIG. 3B shows a case where the oxygen partial pressure is 5.2 mTorr. When the oxygen partial pressure was low, it was found that the IrO$_2$ (110) peak intensity was increased. On the other hand, when the oxygen partial pressure was high, it was found that the IrO$_2$ (200) peak intensity was increased. As a result, the remanent polarization of the ferroelectric capacitor is changed in accordance with the oxygen partial pressure.

As is apparent from FIGS. 3A and 3B, the oxygen partial pressure should be increased in order to improve the crystalline orientation of IrO$_2$; however, this may deteriorate the ferroelectric capacitor due to the absorption of oxygen. To avoid this deterioration, Ir has to be supplied in response to the increased supply of oxygen, which also increases the DC input power and the rate of growing IrO$_2$. As a result, it is difficult to control the thickness of IrO$_2$. In view of the foregoing, the deposition condition of IrO$_2$ is preferably as follows:

the substrate temperature is 200° C.;
the oxygen partial pressure is 4 to 6 mTorr; and the DC input power is 1 to 2 kW.

Under the above-mentioned deposition condition, the rate of growing IrO$_2$ was 150 to 300 nm/min.

FIGS. 4A through 4H are cross-sectional views for explaining a first embodiment of the method for manufacturing a capacitor according to the present invention. This capacitor is applied to a DRAM device or an FeRAM device.

Figure 4A:
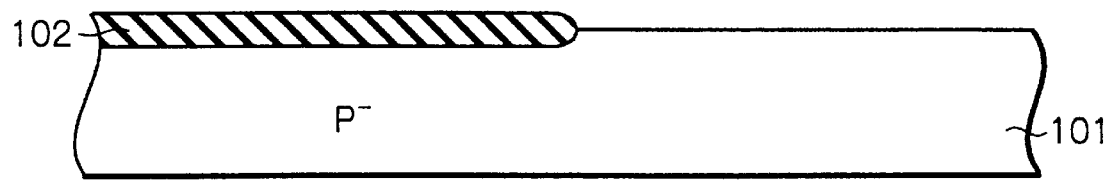
FIGS. 4A through 4H are cross-sectional views for explaining a first embodiment of the method for manufacturing a capacitor according to the present invention.

First, referring to FIG. 4A, a P$^-$-type monocrystalline silicon substrate 101 is thermally oxidized by a local oxidation of silicon (LOCOS) process to grow a field silicon oxide layer 102 for isolating active areas.

Figure 4B:
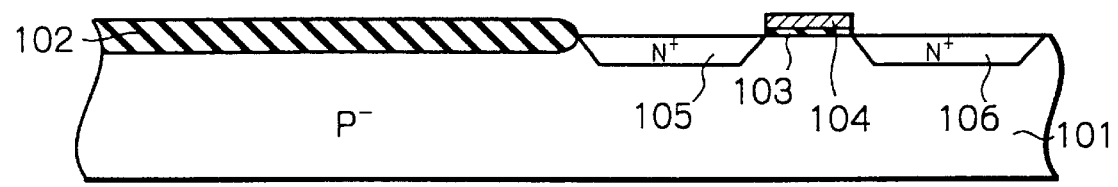

Next, referring to FIG. 4B, the silicon substrate 101 is thermally oxidized to grow a gate silicon oxide layer 103 thereon. Then, a gate electrode layer 104 made of polycrystalline silicon or the like is deposited by a chemical vapor deposition (CVD) process.

Next, the gate electrode layer 104 is patterned by a photolithography and etching process. Then, the gate silicon layer 103 is etched by a wet etching process in self-alignment with the gate electrode layer 104. Then, N-type impurities are implanted into the silicon substrate 101 to form N+-type impurity doped regions 105 and 106 with the silicon substrate 101.

Figure 4C:
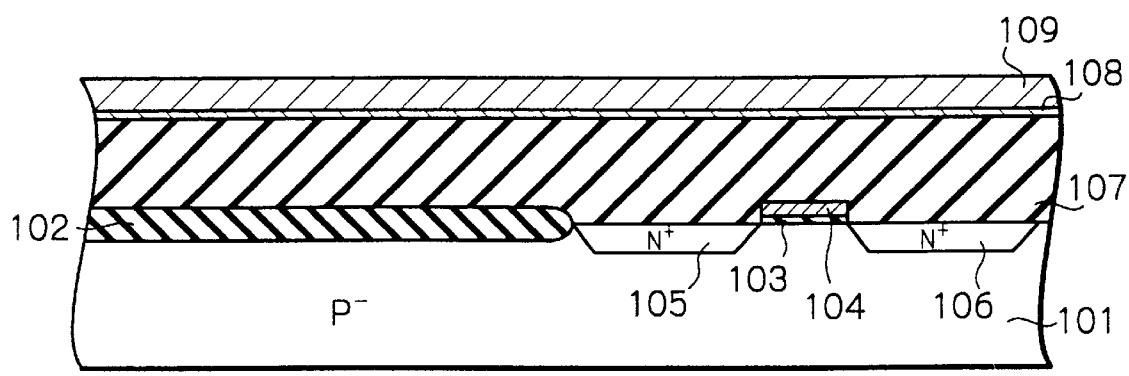

Next, referring to FIG. 4C, a boron-included phosphorus-silicated glass (BPSG) layer 107 is deposited by a CVD process, and the BPSG layer 107 is planerized by a chemical mechanical polishing (CMP) process. Then, an adhesion layer 108 made of titanium (Ti), Ir or IrO$_2$ is deposited by a sputtering process on the BPSG layer 107. Then, a lower electrode layer 109 made of Pt, Ir or IrO$_2$ is deposited by a sputtering process on the adhesion layer 108. Note that, if the lower electrode layer 109 is made of Pt or Ir, Ti has a good adhesion to the lower electrode layer 109 as well as the BPSG layer 107. Also, if the lower electrode layer 109 is made of IrO$_2$ or Ir, Ir or IrO$_2$ has a good adhesion to the lower electrode layer 109 as well as the BPSG layer 107.

If the adhesion layer 108 is made of IrO$_2$ or Ir and the lower electrode layer 9 is made of Ir or IrO$_2$, the laminated layer Ir/IrO$_2$ or IrO$_2$/Ir is deposited by a DC magnetron reactive sputtering process using an Ir target and Ar/O$_2$ mixture gas where the ratio of Ar/O$_2$ is definite such as 75/25 and the substrate temperature is definite such as 200° C., but only the DC input power is changed. For example, for Ir/IrO$_2$, the DC input power is changed from a low value such as 1 kW to a high value such as 6 kW (see FIG. 1). Also, for IrO$_2$/Ir, the DC input power is changed from a high value such as 6 kW to a low value such as 1 kW (see FIG. 1).

Figure 4D:
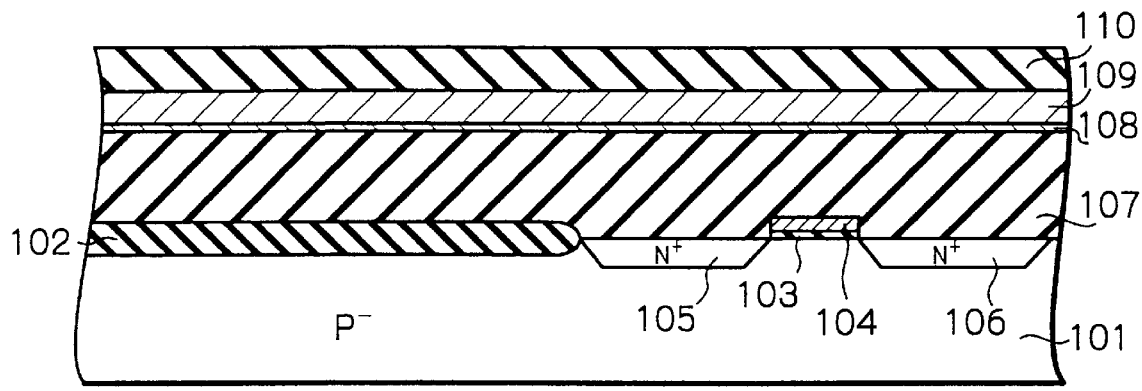

Next, referring to FIG. 4D, a PZT layer 110 is deposited by an RF sputtering process using a Zr/Tr target (Zr/Tr=0.35/0.65) at a substrate temperature of about 450 to 500° C. As a result, the PZT layer 110 has a metastable pyrochlore phase. Then, an oxygen annealing operation at a temperature of about 600° C. is performed upon the PZT layer 110, so that the PZT layer 110 shows a stable perovskite single phase. Note that a BST layer, a Sr Bi$_2$ Ta$_2$ O$_9$ layer or the like can be used instead of the PZT layer 110. Also, these ferroelectric layers can be deposited by a sol-gel process, a metal-organic chemical vapor deposition (MOCVD) process or a laser ablation process.

Figure 4E:
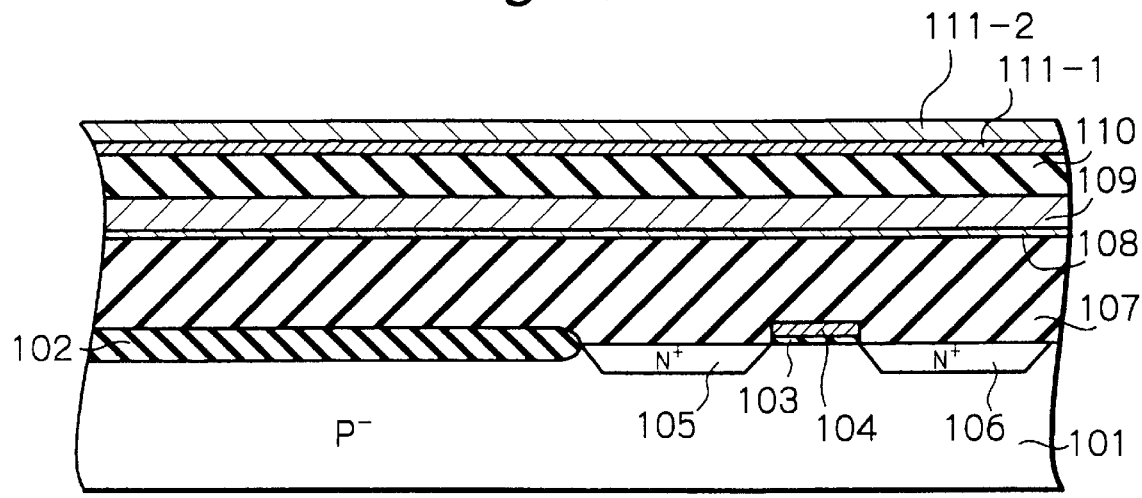

Next, referring to FIG. 4E, an upper electrode layer formed by an IrO$_2$ layer 111-1 and an Ir layer 111-2 is deposited by a DC magnetron reactive sputtering process using an Ir target and Ar/O$_2$ mixture gas where the ratio of Ar/O$_2$ is definite such as 75/25 and the substrate temperature is definite such as 200° C., but only the DC input power is changed. That is, the DC input power is changed from a low value such as 1 kW to a high value such as 6 kW (see FIG. 1). Note that the upper electrode layer can be made of laminated ruthenium/ruthenium oxide (Ru/RuO$_2$). Thus, the upper electrode layer is made of laminated metal/conductive oxide.

Figure 4F:
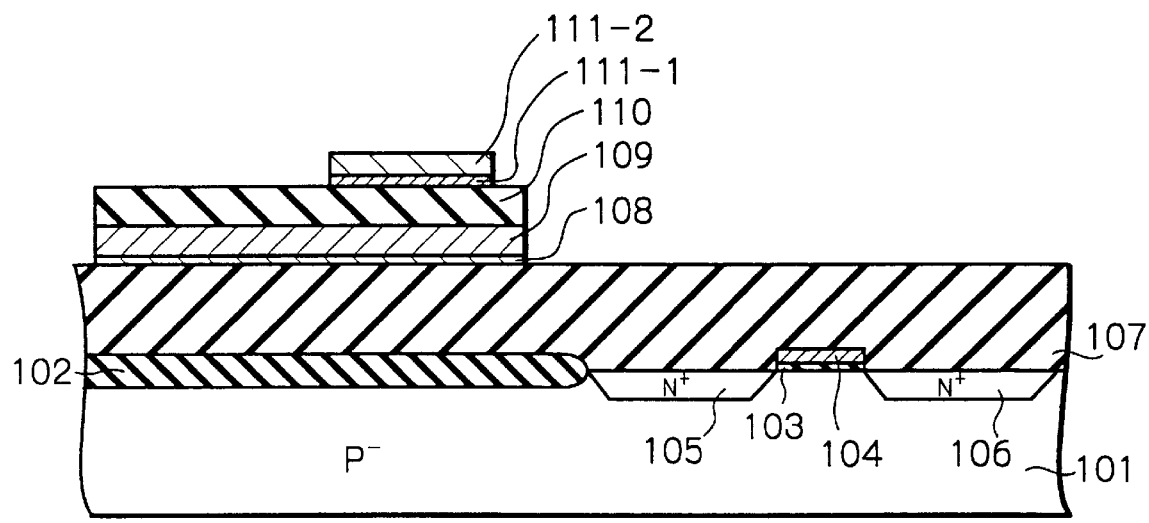

Next, referring to FIG. 4F, the upper electrode layer (111-1, 111-2) is patterned by an ion milling process or a reactive ion etching (RIE) process. Then, the PZT layer 110, the lower electrode 109 and the adhesion layer 108 are patterned by an ion milling process or an RIE process. Then, an oxygen annealing operation is carried out to restore the damage caused by the ion milling process or the RIE process.

Figure 4G:
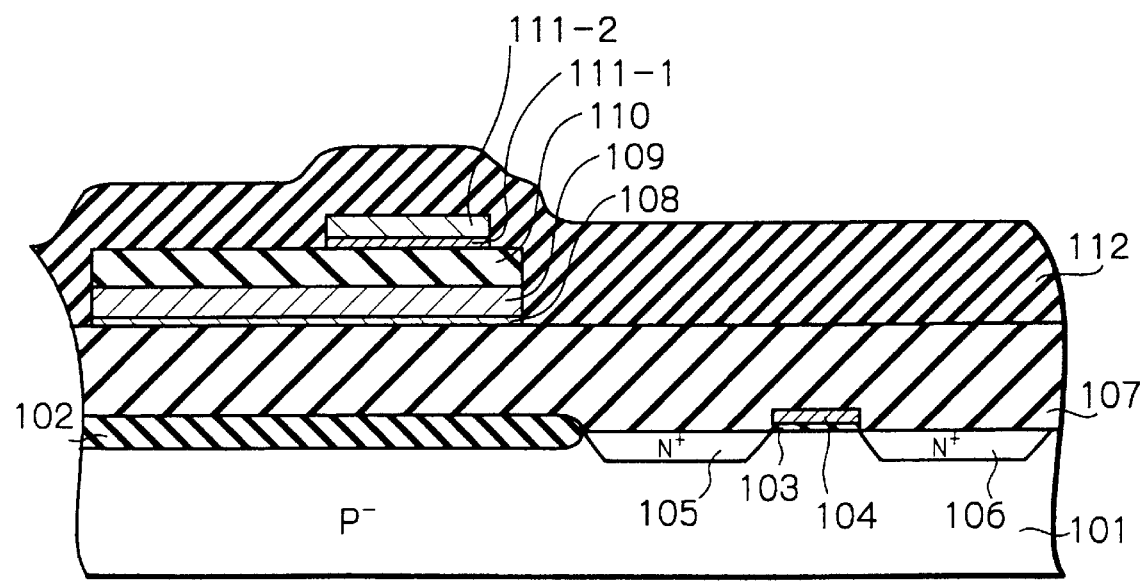

Next, referring to FIG. 4G, a cover insulating layer 112 is deposited by a CVD process using O$_3$-TEOS on the entire surface. In this CVD process, reductant which deteriorates the capacitance characteristics is hardly generated.

Figure 4H:
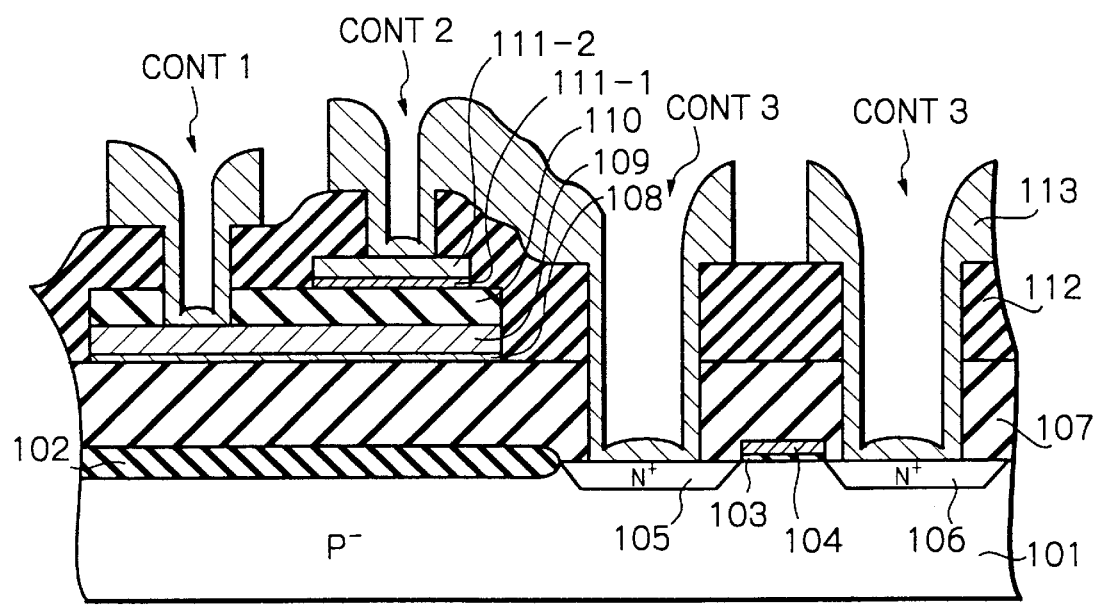

Finally, referring to FIG. 4H, contact holes CONT1 and CONT2 for the lower and upper electrodes, respectively, are perforated in the cover insulating layer 112 and the PZT layer 110 by an RIE process using CF$_4$ plasma gas which hardly generates reductant which deteriorates the capacitance characteristics. Then, contact holes CONT3 for the impurity doped regions 105 and 106 as well as a contact hole (not shown) or the gate electrode layer 104 are perforated in the cover insulating layer 112 and the BPSG layer 107 by an RIE process. The latter RIE process is not limited, since the PZT layer 110 is not exposed. Then, an interconnect (wiring) layer 113 is deposited by a sputtering process, and the interconnect layer 113 is patterned by an RIE process. Thus, the DRAM device or the FeRAM device is completed.

In the above-described first embodiment, since the upper electrode layer made of metal/conductive oxide (111-1, 111-2) is formed by a DC magnetron reactive sputtering process where only the DC input power is changed, the manufacturing process can be simplified.

FIGS. 5A through 5H are cross-sectional views for explaining a second embodiment of the method for manufacturing a capacitor according to the present invention. This capacitor is applied to a DRAM device or an FeRAM device.

Figure 5A:
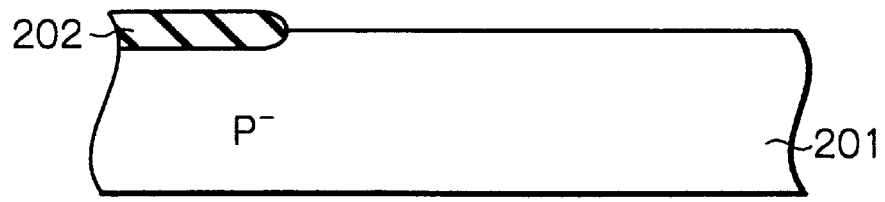
FIGS. 5A through 5H are cross-sectional views for explaining a second embodiment of the method for manufacturing a capacitor according to the present invention.

First, referring to FIG. 5A, in the same way as in FIG. 4A, a P$^-$-type monocrystalline silicon substrate 201 is thermally oxidized by a LOCOS process to grow a field silicon oxide layer 202 for isolating active areas.

Figure 5B:
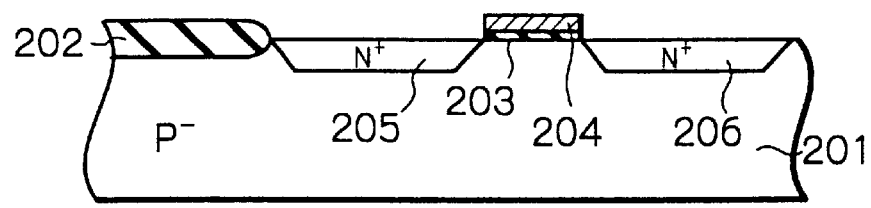

Next, referring to FIG. 5B, in the same way as in FIG. 4B, the silicon substrate 201 is thermally oxidized to grow a gate silicon oxide layer 203 thereon. Then, a gate electrode layer 204 made of polycrystalline silicon or the like is deposited by a CVD process.

Next, the gate electrode layer 204 is patterned by a photolithography and etching process. Then, the gate silicon layer 203 is etched by a wet etching process in self-alignment with the gate electrode layer 204. Then, N-type impurities are implanted into the silicon substrate 201 to form N+-type impurity doped regions 205 and 206 with the silicon substrate 201.

Figure 5C:
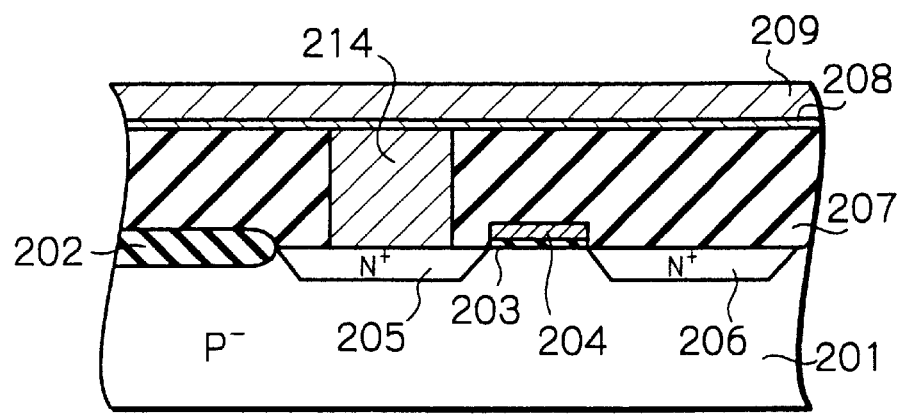

Next, referring to FIG. 5C, a BPSG layer 207 is deposited by a CVD process, and the BPSG layer 207 is planerized by a CMP process. Then, a contact hole leading to the impurity doped region 205 is perforated in the BPSG layer 207. Then, a plug 214 made of tungusten (W) or polycrystalline silicon (Si) is buried in the contact hole by a CVD process and an etching back process. Then, in the same way as in FIG. 4C, a first lower electrode layer 208 made of Ti, Ir or IrO$_2$ is deposited by a sputtering process on the BPSG layer 207. Then, a second lower electrode layer 209 made of Pt, Ir or IrO$_2$, is deposited by a sputtering process on the adhesion layer 208. In this case, the first and second lower electrode layers 208 and 209 correspond to the adhesion layer 108 and the lower electrode 109, respectively.

Figure 5D:
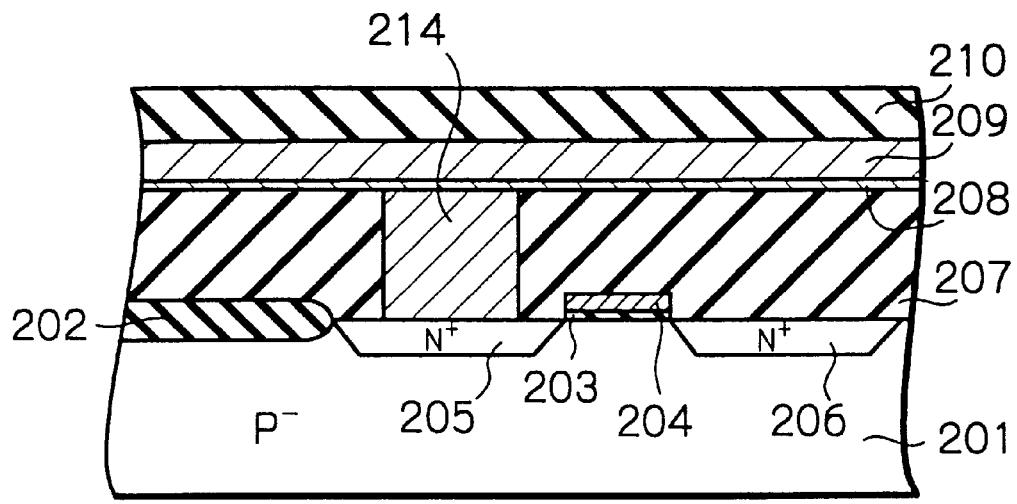

Next, referring to FIG. 5D, in the same way as in FIG. 4D, a PZT layer 210 is deposited by an RF sputtering process using a Zr/Tr target (Zr/Tr=0.35/0.65) at a substrate temperature of about 450 to 500° C. As a result, the PZT layer 210 has a metastable pyrochlore phase. Then, an oxygen annealing operation at a temperature of about 600° C. is performed upon the PZT layer 210, so that the PZT layer 210 shows a stable perovskite single phase.

Figure 5E:
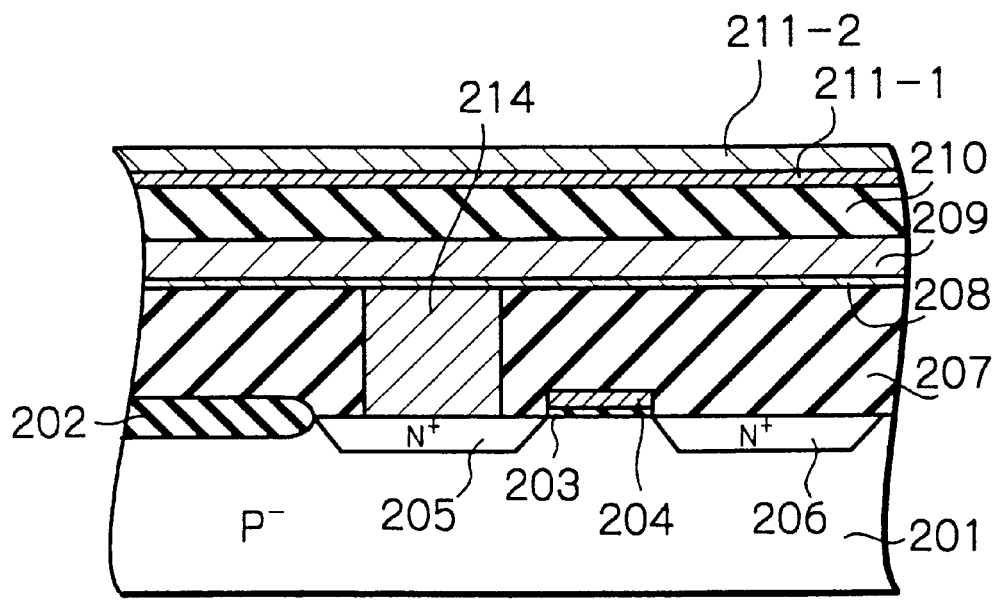

Next, referring to FIG. 5E, in the same way as in FIG. 4E, an upper electrode layer formed by an IrO$_2$ layer 211-1 and an Ir layer 211-2 is deposited by a DC magnetron reactive sputtering process using an Ir target and Ar/O$_2$ mixture gas where the ratio of Ar/O$_2$ is definite such as 75/25 and the substrate temperature is definite such as 200° C., but only the DC input power is changed. That is, the DC input power is changed from a low value such as 1 kW to a high value such as 6 kW (see FIG. 1). Thus, the upper electrode layer is made of laminated metal/conductive oxide.

Figure 5F:
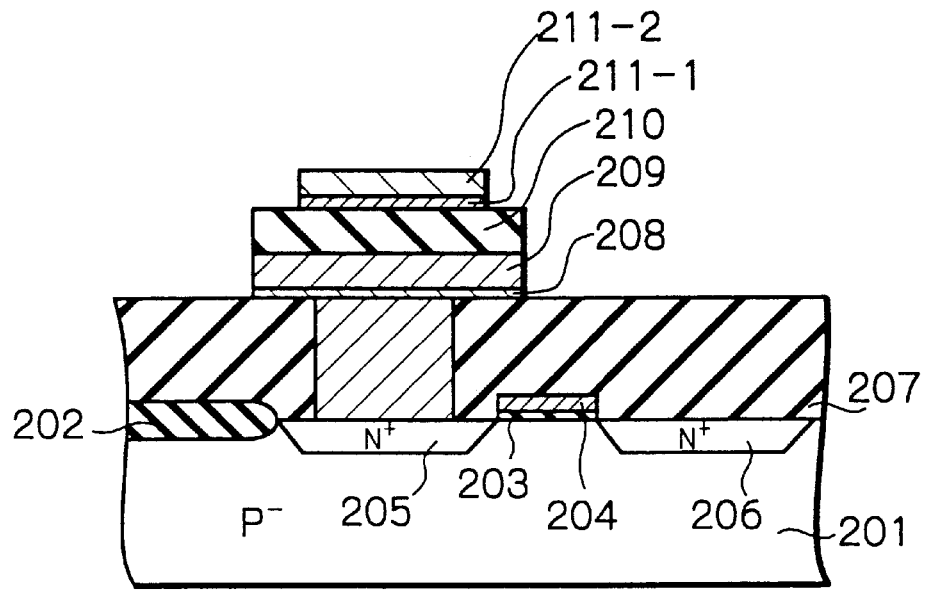

Next, referring to FIG. 5F, in the same way as in FIG. 4F, the upper electrode layer (211-1, 211-2) is patterned by an ion milling processor an RIE process. Then, the PZT layer 210, the second lower electrode layer 209 and the first lower electrode layer 208 are patterned by an ion milling process or an RIE process. Then, an oxygen annealing operation is carried out to restore the damage caused by the ion milling process or the RIE process.

Figure 5G:
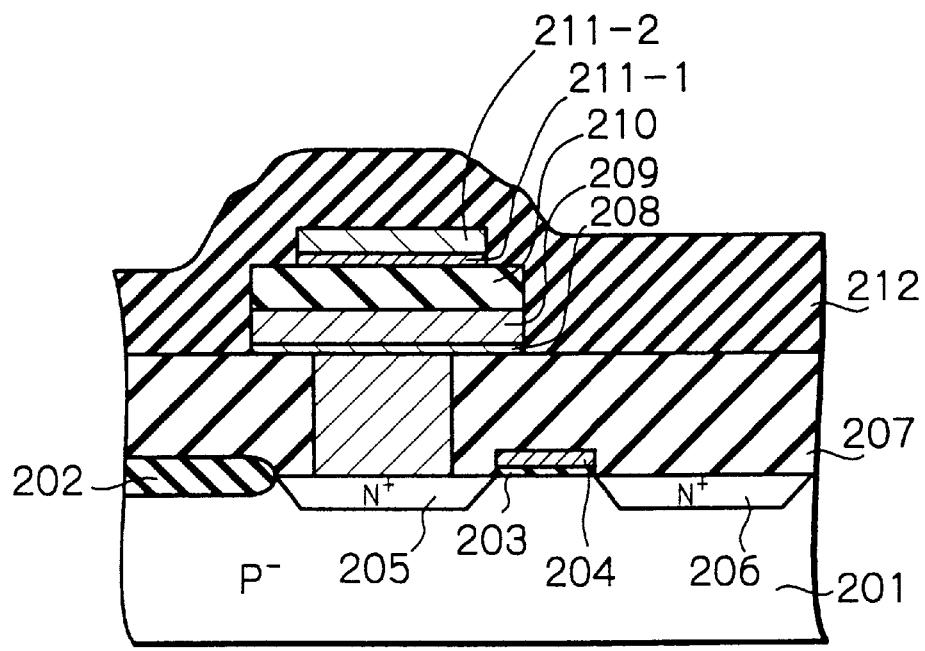

Next, referring to FIG. 5G, in the same way as in FIG. 4G, a cover insulating layer 212 is deposited by a CVD process using $O_3$-TEOS on the entire surface.

Figure 5H:
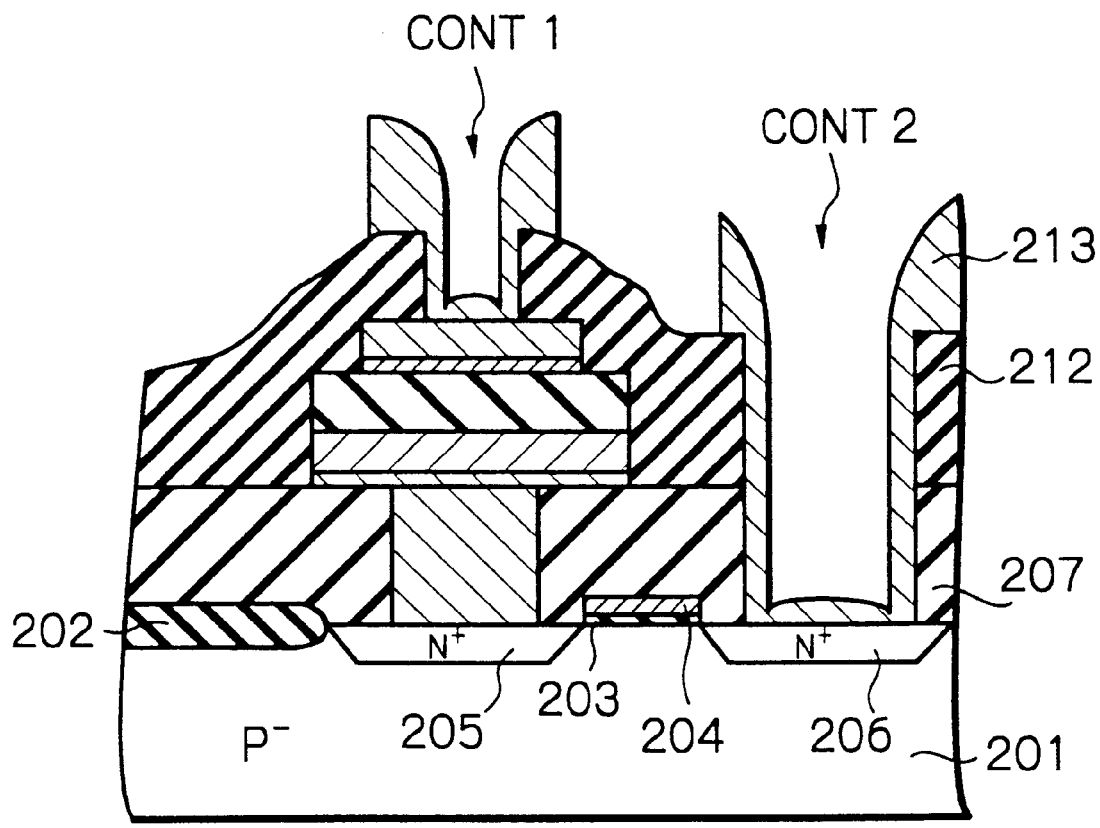

Finally, referring to FIG. 5H, in a similar way to that of FIG. 4H, a contact hole CONT1 for the upper electrode is perforated in the cover insulating layer 212 and the PZT layer 210 by an RIE process using $CF_4$ plasma gas which hardly generates reductant which deteriorates the capacitance characteristics. Then, a contact hole CONT2 for the impurity doped region 206 as well as a contact hole (not shown) for the gate electrode layer 204 are perforated in the cover insulating layer 212 and the BPSG layer 207 by an RIE process. The latter RIE process is not limited, since the PZT layer 210 is not exposed. Then, an interconnect (wiring) layer 213 is deposited by a sputtering process, and the interconnect layer 213 is patterned by an RIE process. Thus, the DRAM device or the FeRAM device is completed.

In the above-described second embodiment, if the lower electrode (208, 209) is formed by a DC magnetron reactive sputtering process where the substrate temperature is low such as 200° C., the plug 214 made of W or Si is hardly oxydized by the oxidative atmosphere for growing the lower electrode (208, 209). Also, if the first lower electrode layer 208 is made of $IrO_2$, the first lower electrode layer 208 has a good adhesion to the BPSG layer 207.

FIGS. 6A through 6I are cross-sectional views for explaining a third embodiment of the method for manufacturing a capacitor according to the present invention. This capacitor is applied to a DRAM device or an FeRAM device.

Figure 6A:
FIGS. 6A through 6I are cross-sectional views for explaining a third embodiment of the method for manufacturing a capacitor according to the present invention.

First, referring to FIG. 6A, in the same way as in FIG. 5A, a P⁻-type monocrystalline silicon substrate 301 is thermally oxidized by a LOCOS process to grow a field silicon oxide layer 302 for isolating active areas.

Figure 6B:
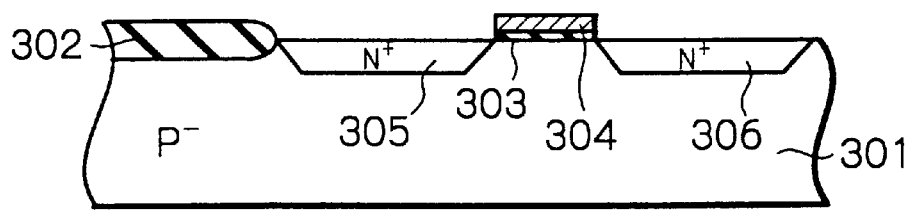

Next, referring to FIG. 6B, in the same way as in FIG. 5B, the silicon substrate 301 is thermally oxidized to grow a gate silicon oxide layer 303 thereon. Then, a gate electrode layer 304 made of polycrystalline silicon or the like is deposited by a CVD process.

Next, the gate electrode layer 304 is patterned by a photolithography and etching process. Then, the gate silicon layer 303 is etched by a wet etching process in self-alignment with the gate electrode layer 304. Then, N-type impurities are implanted into the silicon substrate 301 to form N⁺-type impurity doped regions 305 and 306 with the silicon substrate 301.

Figure 6C:
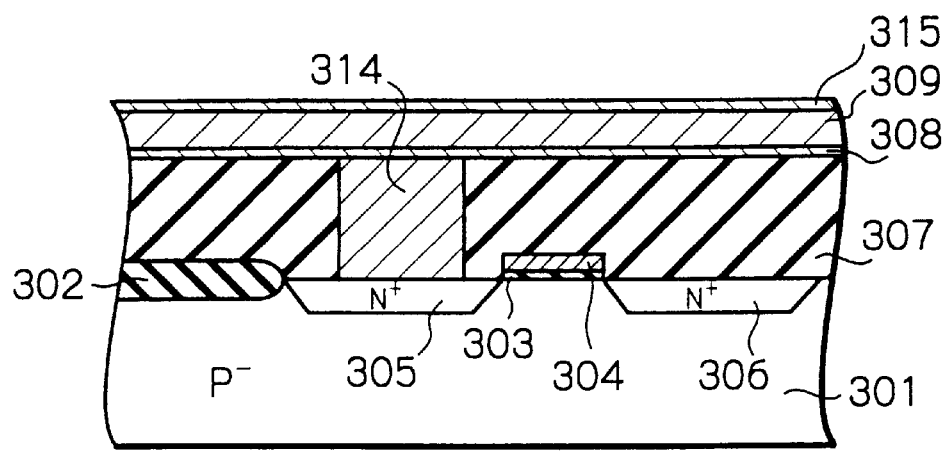

Next, referring to FIG. 6C, a BPSG layer 307 is deposited by a CVD process, and the BPSG layer 307 is planerized by a CMP process. Then, a contact hole leading to the impurity doped region 305 is perforated in the BPSG layer 307. Then, a plug 314 made of W or Si is buried in the contact hole by a CVD process and an etching back process. Then, an about 50 nm thick first lower electrode layer 308 made of $IrO_2$, an about 150 nm thick second lower electrode layer 309 made of Ir and an about 50 nm thick third lower electrode layer 315 made of $IrO_2$ are sequentially deposited by a DC magnetron reactive sputtering process where the ratio of $Ar/O_2$ is definite such as 75/25 and the substrate temperature is definite such as 200° C., but only the DC input power is changed. That is, the DC input power is changed from a low value such as 1 kW to a high value such as 6 kW and return to the low value (see FIG. 1). Thus, the lower electrode (308, 309, 315) is made of laminated conductive oxide/metal/conductive oxide. In this case, the crystalline orientation of $IrO_2$ is adjusted by the substrate temperature and the ratio of $Ar/O_2$.

Figure 6D:
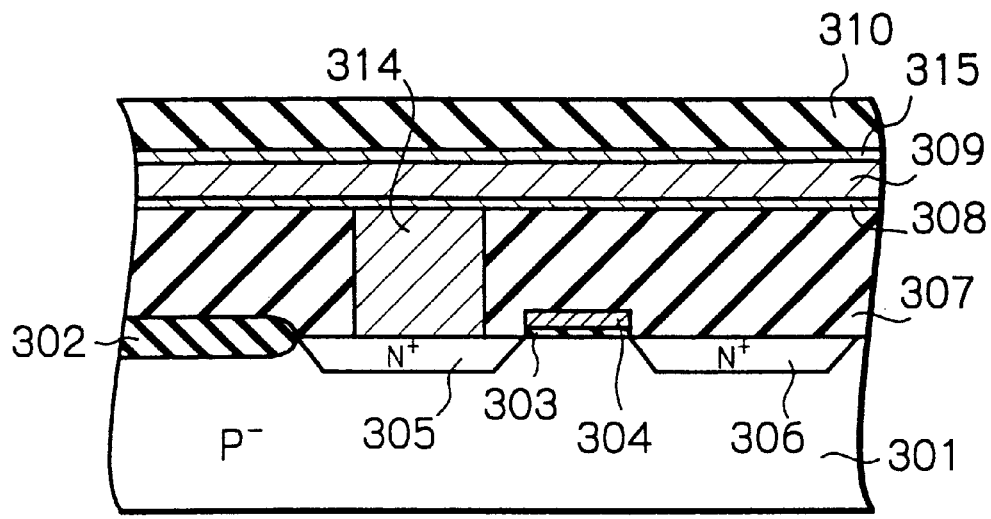
Figure 6E:
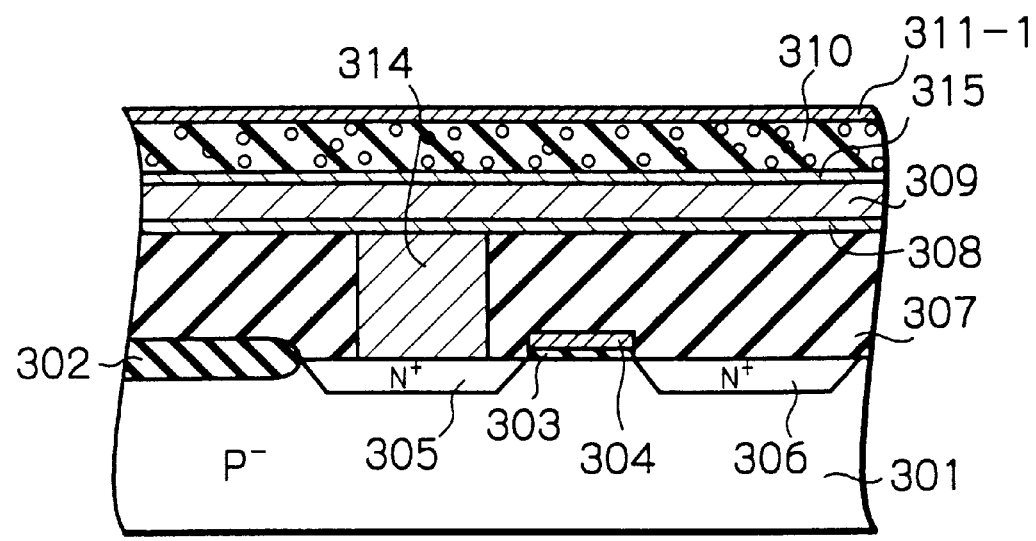

Next, the substrate is transferred by a vacuum chamber from a DC magnetron reactive sputtering apparatus to an RF sputtering apparatus, so that referring to FIG. 6D, a PZT layer 310 is deposited by an RF sputtering process using a Zr/Tr target (Zr/Tr=0.35/0.65) at a substrate temperature of about 450 to 500° C. As a result, the PZT layer 310 has a metastable pyrochlore phase. In this case, the crystalline orientation of the PZT layer 310 corresponds to that of the third lower electrode layer 315.

Next, the substrate is transferred by a vacuum chamber from the RF sputtering apparatus to the DC magnetron reactive sputtering apparatus. Then, referring to FIG. 6E, an about 50 nm thick cover layer 311-1 made of $IrO_2$ which serves as a first upper electrode layer is deposited on the PZT layer 310 by a DC magnetron reactive sputtering process. Then, a rapid thermal annealing operation at a temperature of about 600° C. for about 30 seconds is performed upon the PZT layer 310, so that the PZT layer 310 shows a stable porous perovskite single phase. The porous perovskite single phase PZT layer 310 has a low dielectric, so that the porous perovskite single phase PZT layer 310 is helpful in a low voltage operation of the RAM device. After that, an oxygen annealing operation at about 600° C. for about 20 minutes can be additionally carried out, to homogenize the perovskite crystalline nucleation, thus homogenizing the porosity of the porous PZT layer 310.

Figure 6F:
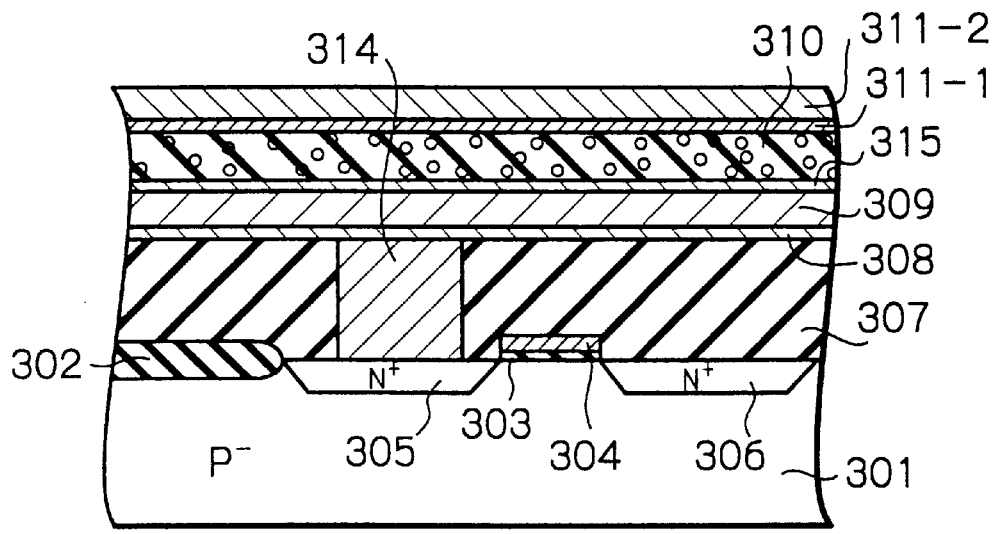

Next, referring to FIG. 6F, an about 150 nm thick upper electrode layer 311-2 made of Ir is deposited by a DC magnetron reactive sputtering process.

Figure 6G:
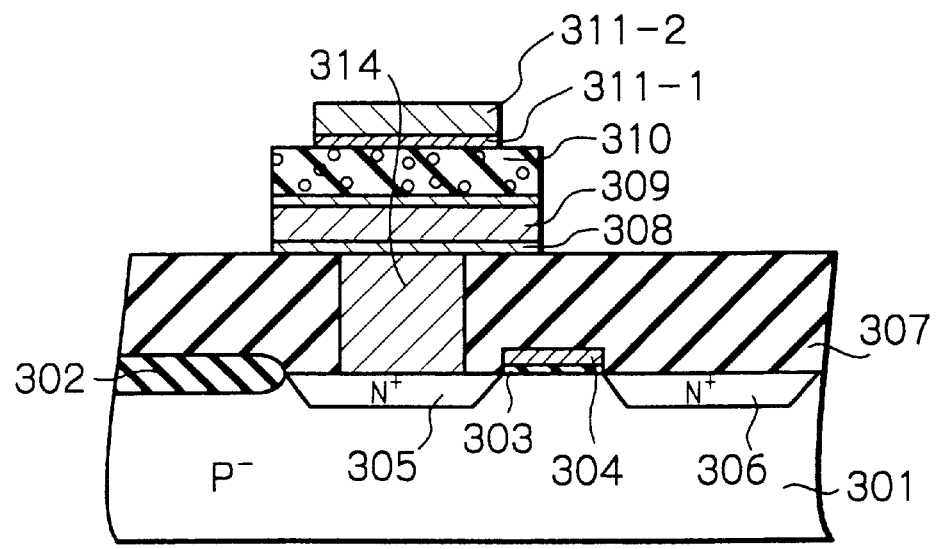

Next, referring to FIG. 6G, in the same way as in FIG. 5F, the upper electrode layer (311-1, 311-2) is patterned by an ion milling process or an RIE process. Then, the PZT layer 310, the second lower electrode layer 309 and the first lower electrode layer 308 are patterned by an ion milling process or an RIE process. Then, an oxygen annealing is carried out to restore the damage caused by the ion milling process or the RIE process.

Figure 6H:
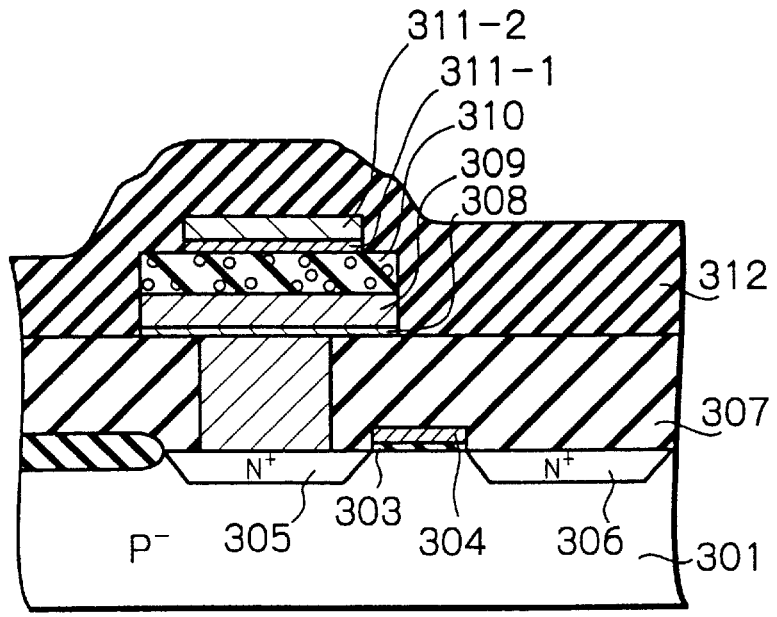

Next, referring to FIG. 6H, in the same way as in FIG. 5G, a cover insulating layer 312 is deposited by a CVD process using $O_3$-TEOS on the entire surface.

Figure 6I:
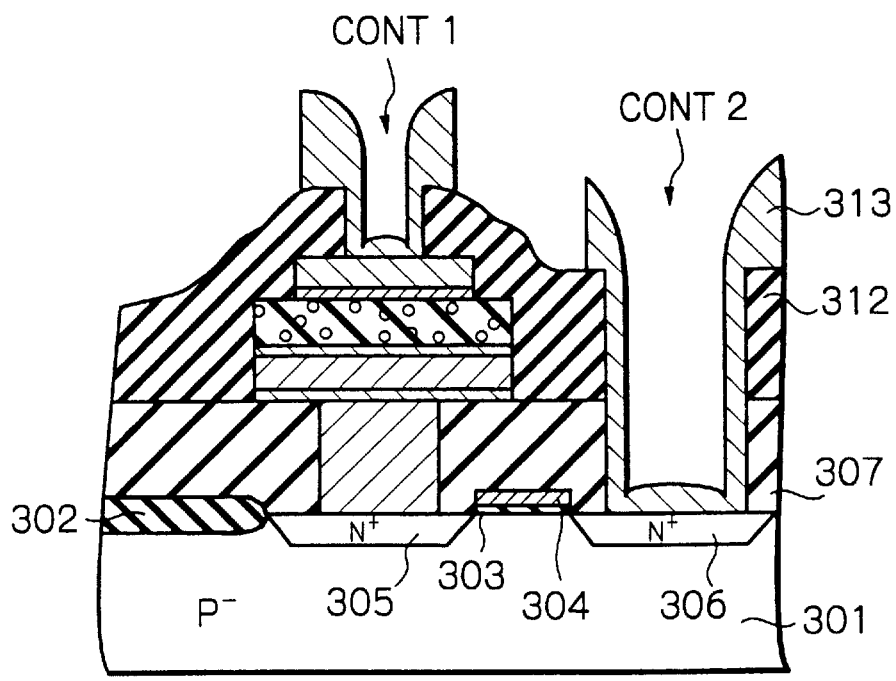

Finally, referring to FIG. 6I, in a similar way to that of FIG. 5H, a contact hole CONT1 for the upper electrode is perforated in the cover insulating layer 312 and the PZT layer 310 by an RIE process using $CF_4$ plasma gas which hardly generates reductant which deteriorates the capacitance characteristics. Then, a contact hole CONT2 for the impurity doped region 306 as well as a contact hole (not shown) for the gate electrode layer 304 are perforated in the cover insulating layer 312 and the BPSG layer 307 by an RIE process. The latter RIE process is not limited, since the PZT layer 310 is not exposed. Then, an interconnect (wiping) layer 313 is deposited by a sputtering process, and the interconnect layer 313 is patterned by an RIE process. Thus, the DRAM device or the FeRAM device is completed.

In the above-described third embodiment, since the cover layer 311-1 is very thin, oxygen can be sufficiently supplied to the PZT layer 310 by the RTA operation or the oxygen annealing operation for a very short time period, so that the PZT layer 310 is homogenously porous.

Also, in the above-described third embodiment, other ferroelectric material can be used as the layer 310. In this case, when such material is changed by a heat treatment from a crystalline phase to another crystalline phase, the material is shrinked so that the material becomes porous. Note that the crystalline orientation of the third lower electrode layer ($IrO_2$) 315 immediately under the layer 310 is indispensable.

As explained hereinabove, according to the present invention, since laminated metal/conductive oxide layers are formed by a DC magnetron reactive sputtering process where only the DC input power is changed, the manufacturing process can be simplified. Also, since the crystalline orientation of the conductive oxide layer is controlled by the substrate temperature of the DC magnetron reactive sputtering process, the crystalline properties of ferroelectric material in contact with the conductive oxide can be improved.

What is claimed is:

1. A method for manufacturing a capacitor including a lower electrode, a ferroelectric layer formed on said lower electrode, and an upper electrode formed on said ferroelectric layer, at least one of said lower and upper electrodes being made of laminated metal and conductive oxide, comprising a step of growing said one of said upper and lower electrodes by a DC magnetron reactive sputtering process using one metal target and mixture gas including oxygen wherein a ratio of oxygen in said mixture gas and a substrate temperature are definite and a DC input power is changed depending on said metal and said conductive oxide.

2. The method as set forth in claim 1, wherein the ratio of oxygen in said mixture gas is determined to optimally define a crystalline orientation of said conductive oxide.

3. The method as set forth in claim 1, wherein the substrate temperature is determined to optimally define a crystalline orientation of said conductive oxide.

4. The method as set forth in claim 1, wherein said metal is iridium and said conductive oxide is iridium oxide.

5. The method as set forth in claim 4, wherein said substrate temperature is approximately between 200° C. and 400° C.

6. The method as set forth in claim 4, wherein said DC input power for said metal is determined so that a ratio of an iridium flux to a partial oxygen pressure is larger than approximately $4.0 \times 10^{15}$ [atoms/($cm^2 \cdot s \cdot mTorr$)] where the ratio of oxygen in said mixture gas is about 75/25 and said substrate temperature is about 200° C.

7. The method as set forth in claim 4, wherein said DC input power for said conductive oxide is determined so that a ratio of an iridium flux to a partial oxygen pressure is smaller than approximately $3.0 \times 10^{15}$ [atoms/($cm^2 \cdot s \cdot mTorr$)] where the ratio of oxygen in said mixture gas is about 75/25 and said substrate temperature is about 200° C.

8. The method as set forth in claim 1, wherein said ferroelectric layer is made of PZT.

9. A method for manufacturing a capacitor, comprising the steps of:

forming an insulating layer on a semiconductor substrate;

forming an adhesion layer on said insulating layer;

forming a lower electrode layer on said adhesion layer;

forming a ferroelectric layer on said lower electrode layer;

sequentially forming a first upper electrode layer made of conductive oxide and a second upper electrode layer made of metal by a DC magnetron reactive sputtering process using one metal target and mixture gas including oxygen wherein a ratio of oxygen in said mixture gas and a substrate temperature are definite and a DC input power is changed for said first and second upper electrode layers;

patterning said first and second upper electrode layers; and patterning said ferroelectric layer, said lower electrode layer and said adhesion layer, after said first and second upper electrode layers are patterned.

10. The method as set forth in claim 9, wherein the ratio of oxygen in said mixture gas is determined to optimally define a crystalline orientation of the conductive oxide of said first upper electrode layer.

11. The method as set forth in claim 9, wherein the substrate temperature is determined to optimally define a crystalline orientation of the conductive oxide of said first upper electrode layer.

12. The method as set forth in claim 9, wherein said metal is iridium and said conductive oxide is iridium oxide.

13. The method as set forth in claim 12, wherein said substrate temperature is approximately between 200° C. and 400° C.

14. The method as set forth in claim 9, wherein said ferroelectric layer forming step comprises:

forming a pyrochlore phase layer by a sputtering process; and performing an oxygen annealing operation upon said pyrochlore phase layer so that said pyrochlore phase layer is changed to a perovskite phase ferroelectric layer as said ferroelectric layer.

15. The method as set forth in claim 9, wherein said adhesion layer is made of one of titanium, iridium and iridium oxide, and said lower electrode layer is made of platinum, iridium and iridium oxide.

16. The method as set forth in claim 9, wherein said adhesion layer is made of one of iridium and iridium oxide, and said lower electrode layer is made of the other of iridium and iridium oxide, said adhesion layer and lower electrode forming steps comprising a step of sequentially depositing said adhesion layer and said lower electrode layer by a DC magnetron reactive sputtering process using one iridium target and mixture gas including oxygen wherein a ratio of oxygen in said mixture gas and a substrate temperature are definite and a DC input power is changed for iridium and iridium oxide.

17. A method for manufacturing a capacitor, comprising the steps of:

forming an insulating layer on a semiconductor substrate;

perforating a contact hole in said insulating layer;

burying a conductive plug in said contact hole;

forming a first lower electrode layer on said insulating layer and said conductive plug;

forming a second lower electrode layer on said first lower electrode layer;

forming a ferroelectric layer on said lower electrode layer;

sequentially forming a first upper electrode layer made of conductive oxide and a second upper electrode layer made of metal by a DC magnetron reactive sputtering process using one metal target and mixture gas including oxygen wherein a ratio of oxygen in said mixture gas and a substrate temperature are definite and a DC input power is changed for said first and second upper electrode layers;

patterning said first and second upper electrode layers; and patterning said ferroelectric layer and said first and second lower electrode layers, after said first and second upper electrode layers are patterned.

18. The method as set forth in claim 17, wherein the ratio of oxygen in said mixture gas is determined to optimally define a crystalline orientation of the conductive oxide of said first upper electrode layer.

19. The method as set forth in claim 17, wherein the substrate temperature is determined to optimally define a crystalline orientation of the conductive oxide of said first upper electrode layer.

20. The method as set forth in claim 17, wherein said metal is iridium and said conductive oxide is iridium oxide.

21. The method as set forth in claim 20, wherein said substrate temperature is approximately between 200° C. and 400° C.

22. The method as set forth in claim 17, wherein said ferroelectric layer forming step comprises:

forming a pyrochlore phase layer by an sputtering process; and performing an oxygen annealing operation upon said pyrochlore phase layer so that said pyrochlore phase layer is changed to a perovskite phase ferroelectric layer as said ferroelectric layer.

23. The method as set forth in claim 17, wherein said first lower electrode layer is made of one of titanium, iridium and iridium oxide, and said second lower electrode layer is made of platinum, iridium and iridium oxide.

24. The method as set forth in claim 17, wherein said first lower electrode layer is made of one of iridium and iridium oxide, and said second lower electrode layer is made of the other of iridium and iridium oxide, said first and second lower electrode forming steps comprising a step of sequentially depositing said first and said second lower electrode layers by a DC magnetron reactive sputtering process using one iridium target and mixture gas including oxygen wherein a ratio or oxygen in said mixture gas and a substrate temperature are definite and a DC input power is changed for iridium and iridium oxide.

25. A method for manufacturing a capacitor, comprising the steps of:

forming an insulating layer on a semiconductor substrate;

perforating a contact hole in said insulating layer;

burying a conductive plug in said contact hole;

sequentially forming a first lower electrode layer made of conductive oxide, a second lower electrode layer made of metal and a third lower electrode layer made of conductive oxide on said insulating layer and said conductive plug by a DC magnetron reactive sputtering process using one metal target and mixture gas including oxygen wherein a ratio of oxygen in said mixture gas and a substrate temperature is definite and a DC input power is changed for said metal and said conductive oxide;

forming a pyrochlore phase layer on said third lower electrode layer;

forming a first upper electrode layer made of conductive oxide by a DC magnetron reactive sputtering process on said pyrochlore phase layer;

performing a heating operation upon said pyrochlore phase layer so that said pyrochlore phase layer becomes a porous perovskite phase ferroelectric layer, after said first upper electrode layer is formed;

forming a second upper electrode layer made of metal by a DC magnetron reactive sputtering process, after said heating operation is performed;

patterning said first and second upper electrode layers; and patterning said ferroelectric layer and said first, second and third lower electrode layers, after said first and second upper electrode layers are patterned.

26. The method as set forth in claim 25, wherein said heating operation is a rapid thermal annealing operation.

27. The method as set forth in claim 26, further comprising a step of performing an oxygen annealing operation upon said pyrochlore phase layer after said rapid thermal annealing operation is performed.

28. The method as set forth in claim 25, wherein said first and third lower electrode layer and said first upper electrode layer are made of iridium oxide, and said second lower electrode layer and said second upper electrode layer are made of iridium.

* * * * *